(12) United States Patent
Shiraishi et al.

(10) Patent No.: US 7,317,227 B2
(45) Date of Patent: Jan. 8, 2008

(54) METHOD FOR FORMING PATTERN OF STACKED FILM

(75) Inventors: Hitoshi Shiraishi, Tokyo (JP); Kenichi Hayashi, Tokyo (JP); Naoto Hirano, Tokyo (JP); Atsushi Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 185 days.

(21) Appl. No.: 10/855,394

(22) Filed: May 28, 2004

(65) Prior Publication Data

US 2004/0219721 A1    Nov. 4, 2004

Related U.S. Application Data

(62) Division of application No. 10/446,713, filed on May 29, 2003, now Pat. No. 6,933,241.

(30) Foreign Application Priority Data

Jun. 6, 2002    (JP)    ............... 2002-165163

(51) Int. Cl.
*H01L 27/01*    (2006.01)

(52) U.S. Cl. ............... 257/353; 257/354; 257/E27.116; 257/E29.151; 257/E29.273; 257/E21.535; 257/E21.412; 257/E21.413; 438/153; 438/154; 438/164

(58) Field of Classification Search ............... 257/288, 257/401, E29.134, E29.137, 623, 775, 776, 257/352, 347, 353, 354, E27.116, E29.151, 257/E29.273, E21.535, E21.411, E21.413, 257/E21.412; 438/713, 714, 719, 738, 694, 438/695, 696, 701
See application file for complete search history.

(56) References Cited

U.S. PATENT DOCUMENTS

| | | | | |
|---|---|---|---|---|
| 4,546,376 A | * | 10/1985 | Nakata et al. ............... 257/354 |
| 5,241,207 A | * | 8/1993 | Toyoshima et al. ......... 257/384 |
| 5,663,578 A | | 9/1997 | Hsu et al. ...................... 257/66 |
| 5,668,379 A | * | 9/1997 | Ono et al. ...................... 257/59 |
| 5,728,259 A | | 3/1998 | Suzawa et al. ............. 438/164 |
| 5,856,239 A | * | 1/1999 | Bashir et al. ............... 438/738 |

(Continued)

FOREIGN PATENT DOCUMENTS

| | | |
|---|---|---|
| JP | 01-100924 | 4/1989 |
| JP | 02-082579 | 3/1990 |

(Continued)

*Primary Examiner*—George R. Fourson
*Assistant Examiner*—Julio J. Maldonado
(74) *Attorney, Agent, or Firm*—McGinn IP Law, Group, PLLC

(57) ABSTRACT

A semiconductor film serving as an active region of a thin film transistor and an upper oxide film protecting the semiconductor film are dry etched to form the active region. In this case, a fluorine-based gas is used as the etching gas, and the etching gas is switched from the fluorine-based gas to a chlorine-based gas at a point of time when a lower oxide film as an underlying film of the semiconductor film is exposed. As the fluorine-based gas, a mixed gas of $CF_4$ and $O_2$ is used, and suitably, a gas ratio of $CF_4$ and $O_2$ in the mixture gas is set at 1:1, and the dry etching is performed therefor. By this etching, a side face of a two-layer structure of the semiconductor film and upper oxide film is optimally tapered, and a crack or a disconnection is prevented from being occurring in a film crossing over the two-layer structure.

20 Claims, 9 Drawing Sheets

U.S. PATENT DOCUMENTS

| | | | |
|---|---|---|---|
| 6,124,154 A | 9/2000 | Miyasaka | 438/151 |
| 6,235,214 B1 | 5/2001 | Deshmukh et al. | 216/67 |
| 6,399,286 B1 | 6/2002 | Liu et al. | 430/316 |
| 7,238,600 B2 | 7/2007 | Yamazaki et al. | 438/592 |
| 2004/0135216 A1* | 7/2004 | Suzawa et al. | 257/408 |

FOREIGN PATENT DOCUMENTS

| | | |
|---|---|---|
| JP | 09-263974 | 10/1997 |
| JP | 2001-332741 | 11/2001 |
| JP | 2003-131261 | 5/2003 |

* cited by examiner

ISLAND

GATE ELECTRODE

ISLAND (103,104)

GATE ELECTRODE (106,107)

$45° \leqq \theta \leqq 60°$
$10° \leqq \theta \leqq 60°$

US 7,317,227 B2

METHOD FOR FORMING PATTERN OF STACKED FILM

The present Application is a Divisional Application of U.S. patent application Ser. No. 10/446,713, filed on May 29, 2003 now U. S. Pat. No. 6,933,241.

BACKGROUND OF THE INVENTION

1. Field of the Invention

The present invention relates to a method for forming a pattern of a stacked film, and more particularly, to a method for forming a stacked film composed of a polysilicon film and an upper oxide film, which are formed on a lower oxide film.

2. Description of the Related Art

FIGS. 1A and 1B and FIGS. 2A and 2B illustrate schematic views of two-layer structures, each of which is composed of a polysilicon film and an upper oxide film for fabricating a conventional thin film transistor. FIG. 1A is a plan view of a two-layer structure, and FIG. 1B is a cross-sectional view obtained by cutting the two-layer structure of FIG. 1A along the line I-I. FIG. 2A is a plan view of a two-layer structure, and FIG. 2B is a cross-sectional view obtained by cutting the two-layer structure of FIG. 2A along the line II-II.

In each case, the lower oxide film ($SiO_2$) 502 is deposited on the glass substrate 501 with a thickness of approximately 300 nm. Next, the silicon film 503 and the upper oxide film 504, which configure the two-layer structure, are deposited on the lower oxide film 502 with thicknesses of 60 m and 10 nm, respectively. Subsequently, the silicon film 503 is crystallized by an excimer laser, thus forming a polysilicon (poly-Si) film.

Next, dry etching is conducted simultaneously for the silicon film 503 and the upper oxide film 504, which configure the two-layer structure, followed by formation of the side face of the two-layer structure of the polysilicon film 503 with the thickness of 60 nm and upper oxide film 504 with the thickness of 10 nm at an angle of approximately 90° (vertical shape) with respect to the glass substrate.

The reason that the two-layer structure is composed of the polysilicon film and the upper oxide film is to protect the surface of the polysilicon film, which is an active layer, and keep the same surface clean. In addition, the reason that the film thicknesses in the two-layer structure are set at 10 nm for the upper oxide film and 60 nm for the polysilicon film is for thinning the film thickness of the upper oxide film as much as possible and facilitating the formation of the two-layer structure by dry etching. Detailed contents of this will be described later in a section of a method for forming a two-layer structure.

After the formation of the two-layer structure described above, high-concentration phosphorus ions are doped into the polysilicon film in the two-layer structure, thus forming a source/drain (not shown). Subsequently, low-concentration phosphorus ions are doped, thus forming a lightly doped drain (LDD). Thereafter, the gate oxide film 505 is formed in a thickness of 45 nm, followed by deposition of a two-layer film formed of a micro-crystalline silicon (μc-Si) film 506 and the Cr film 507. Then, the two-layer film is etched, thus forming the gate electrode 521. As the gate electrode 521, the Cr film 507 made of a metal with a high melting point is used because of its outstanding ability to resist heat, as well as its low electric resistance. Moreover, the μc-Si film 506, which has a specific work function, is used as an interlayer film because of its easiness in controlling threshold values. For the high melting point metal utilized as a gate material, W, Mo, Ti, Ta or a silicide film of any of these can be used as well as Cr. Thereafter, a heat treatment at a temperature of 350° C. or more is conducted, thus activating impurities contained in the polysilicon film of the two-layer structure, into which the phosphorus is doped. Thus, the electric resistance of the polysilicon in the portion into which the phosphorus is doped is lowered.

After the steps described above, a protective oxide film (not shown) is further deposited in a thickness of 300 nm. Then, a contact to communicate with the polysilicon film in the activated two-layer structure is opened in the protective oxide film and the gate oxide film, and Al wiring is formed thereon. Thus, a desired thin film transistor is obtained.

Next, a method for forming the foregoing two-layer structure will be described with reference to cross-sectional views of FIGS. 3A to 3C.

As a method for etching the foregoing upper oxide film and polysilicon film, a gas containing $CF_4$ and $O_2$ is used, and the entire upper oxide film 604 and a part of the polysilicon film 603 are simultaneously etched by reactive ions, using the photoresist 608 as a mask. The etching conditions in this case are set as:

Gas mixture ratio: $CF_4:O_2=4:1$

RF power: 700W

In these etching conditions, the foregoing two-layer structure is etched close to vertically.

The residual polysilicon film is etched under the following etching conditions by use of the gas containing $CF_4$ and $O_2$:

Gas mixture ratio: $CF_4: O_2=4:1$

RF power: 300 W

Specifically, the RF power in the above conditions is lowered than that in the initial etching conditions. In this type of low RF power condition, an etching rate for the polysilicon film 603 is higher than that for the lower oxide film 602. Thus, the etching for the lower oxide film is restricted to the minimum. However, in this case, the etching rate for the upper oxide film on the polysilicon film 603 is simultaneously slowed. Hence, at the time when the etching for the polysilicon film is completed, the polysilicon film is over-etched in the lateral direction with respect to the upper and lower oxide films, and the upper oxide film 604 is formed into a shape overhanging the polysilicon film 603.

In addition, after forming the two-layer structure, its surface is cleaned by a diluted hydrofluoric acid treatment for approximately 10 seconds, followed by deposition of the gate oxide film. The overhang of the oxide film, which is formed by etching the polysilicon film, can be removed by etching using the diluted hydrofluoric acid treatment because the film thickness of the upper oxide film is 10 nm. Because the etching rate by the diluted hydrofluoric acid treatment is several nm/min, the portion of the oxide film, which hangs during the work of immersion of the substrate for 10 seconds and pull-up thereof, is removed by etching from the upper and lower sides thereof. Hence, it is necessary to thin the film thickness of the two-layer structure to 10 nm (60 nm for the polysilicon film) If the film thickness of the upper oxide film is thickened more than 10 nm, then the time necessary for the diluted hydrofluoric acid treatment, required for removing the overhang, must be more than 10 seconds, and an excessive etching of the lower oxide film occurs on an interface between the polysilicon film and the lower oxide film. In addition, if the polysilicon film is thickened to more than 60 nm, then variations in etching in the case of selectively removing the polysilicon film by etching are increased, thus making it difficult to control the dimension of the polysilicon film and to switch off the TFT.

As described above, if the conventional process is used, then the excessive etching of the lower oxide film has hardly occurred under the polysilicon film, and the two-layer structure has been formed such that its side face can be close to vertical.

As shown in FIG. 2B which is the cross-sectional view obtained by cutting the plan view of FIG. 2A, the conventional two-layer structure is formed into a shape in which the side faces of the upper oxide film 504 and polysilicon film 503 are close to vertical with respect to the base.

Hence, if the three-layer film formed of the gate oxide film 505, the micro-crystalline silicon film 506 for the gate electrode and the Cr film 507 is deposited on the two-layer structure, the three-layer film is thickened on the two-layer structure and the lower oxide film excluding the same on the two-layer structure, and thinned on the sidewall portion of the two-layer structure. This means that the three-layer film does not sufficiently cover the sidewall step portion of the two-layer structure. As a result, a stress concentrates upon the three-layer film located on the sidewall of the two-layer structure, and the crack 515 occurs on the three-layer film. If the crack 515 exists on the three-layer film, then there is a possibility that a short-circuit of the gate electrode will occur in the portion of the crack 515 when the impurities contained in the polysilicon film in the two-layer structure are activated by use of a laser. Particularly, in the case of composing the gate electrode from a high melting point metal of a columnar structure, such as Cr, as in the present invention, the structure is weak against stress, and the crack 515 is more prone to occur.

In general, the surface of the polysilicon film configuring the two-layer structure is uneven, and its morphology is bad. Therefore, it is thought that the gate oxide film and the gate electrode on the two-layer structure are not evenly deposited and that the cracks become prone to occur on the thin portions of the gate oxide film and gate electrode.

SUMMARY OF THE INVENTION

It is an object of the present invention to provide, with regard to a stacked structure of a lower oxide film, a semiconductor film and an upper oxide film, a method for forming a pattern of a stacked film composed of a semiconductor film and an upper oxide film, the pattern of the stacked film being capable of absorbing a physical stress on an insulating film and wiring, which cover the pattern of the stacked film, and capable of preventing a crack of the insulating film and a disconnection.

The method for forming a pattern of a stacked film according to the present invention includes the steps of: sequentially depositing a first oxide film, a semiconductor film and a second oxide film on a substrate; laser annealing the semiconductor film; forming a resist pattern on the second oxide film; and forming the pattern of the stacked film composed of the semiconductor film and the second oxide film by dry etching the second oxide film and the semiconductor film by use of the resist pattern as a mask, wherein fluorine-based gas is used as an etching gas for use in the dry etching in the step of forming a pattern of a stacked film.

The method for forming a pattern of a stacked film according to the present invention further performs the dry etching while setting a gas ratio of $CF_4$ and $O_2$ in a mixture gas thereof at 1:1 to make a taper angle of the second oxide film of the pattern of the stacked film larger than a taper angle of the semiconductor film, and the taper angles of the second oxide film and semiconductor film are controlled into ranges of $45°<\theta<60°$ and $10°<\gamma<60°$, respectively.

DETAILED DESCRIPTION OF THE PREFERRED EMBODIMENTS

Figure 1A:
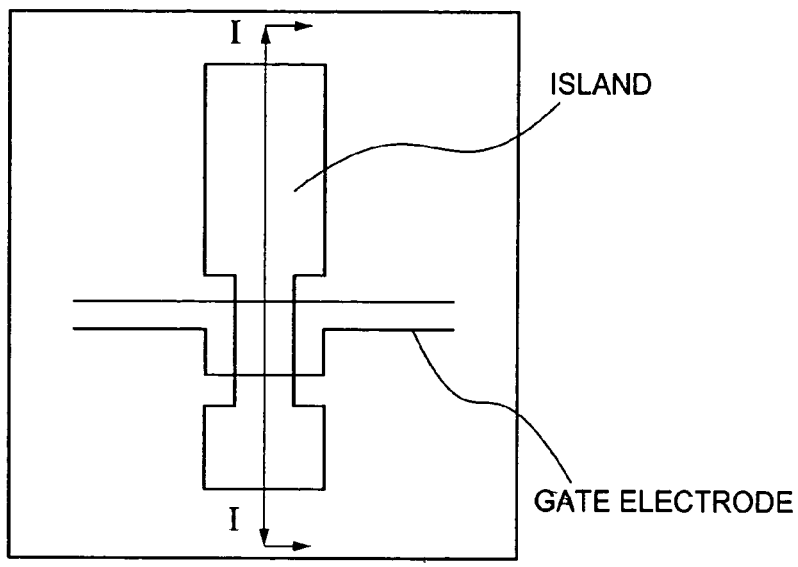
FIG. 1A is a plan view of a two-layer structure composed of a semiconductor film and a second oxide film.
Figure 1B:
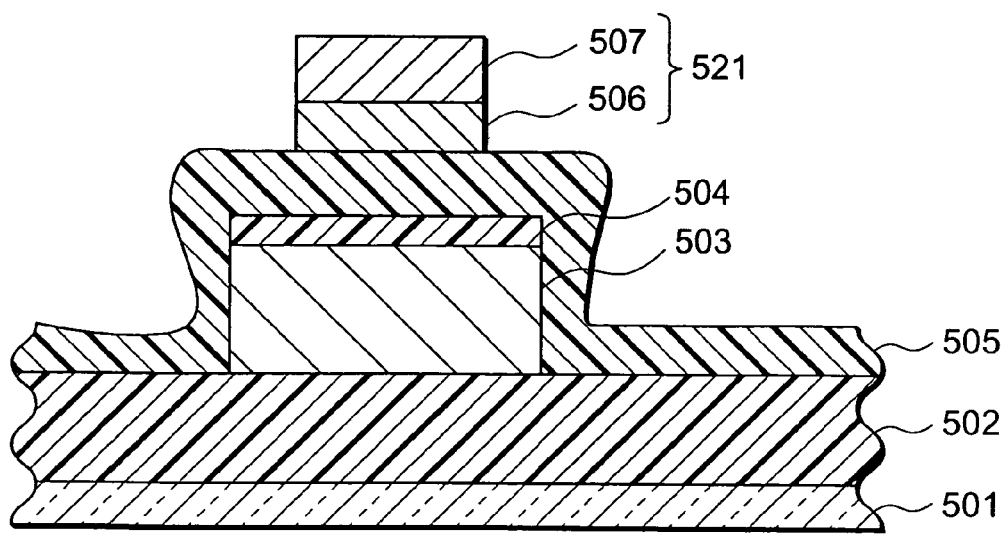
FIG. 1B is a cross-sectional view obtained by cutting the two-layer structure of FIG. 1A along a line I-I.
Figure 2A:
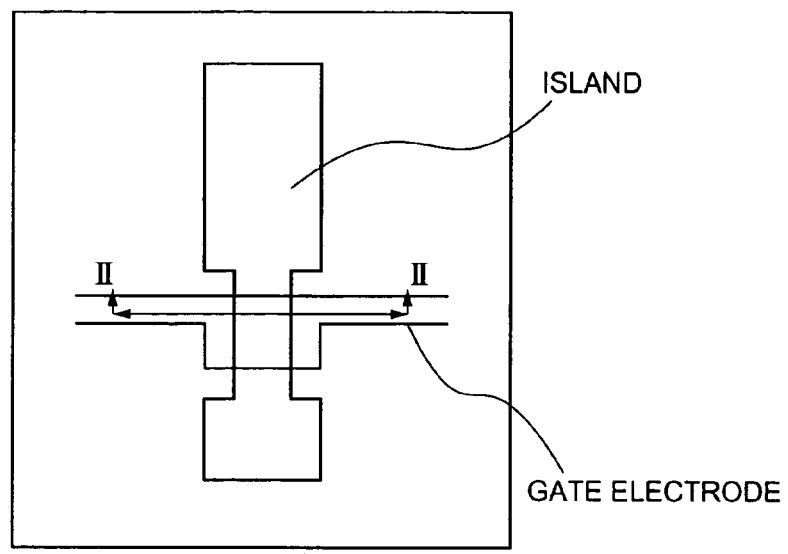
FIG. 2A is a plan view of a two-layer structure.
Figure 2B:
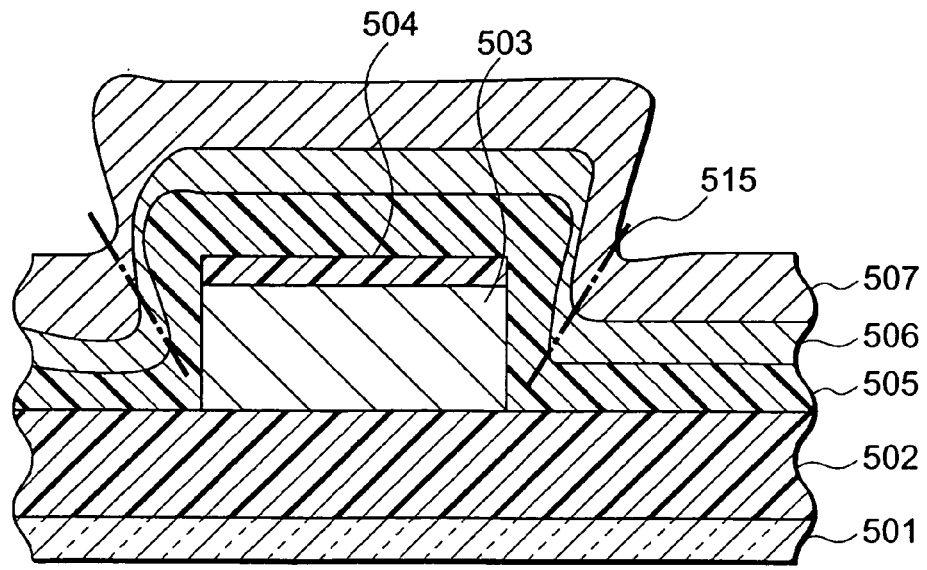
FIG. 2B is a cross-sectional view obtained by cutting the two-layer structure of FIG. 2A along a line II-II.
Figure 3A:
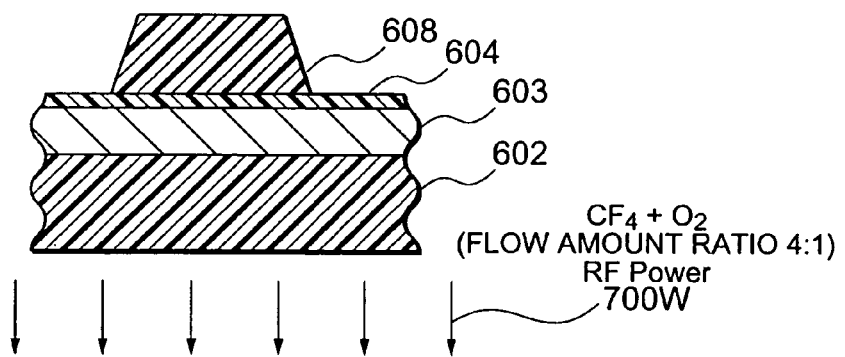
FIG. 3A is a cross-sectional view of a two-layer structure, illustrating an initial step of a method for forming a two-layer structure.
Figure 3B:
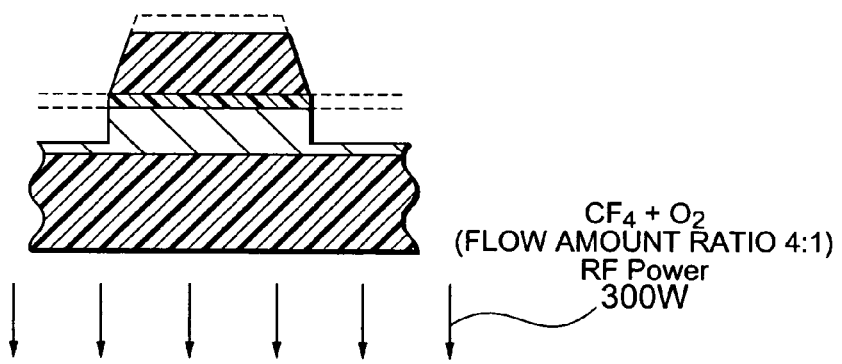
FIG. 3B is a cross-sectional view illustrating a step following FIG. 3A.
Figure 3C:
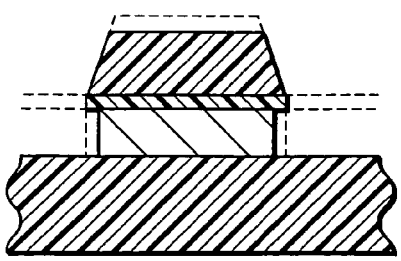
FIG. 3C is a cross-sectional view illustrating a step following FIG. 3B.
Figure 4A:
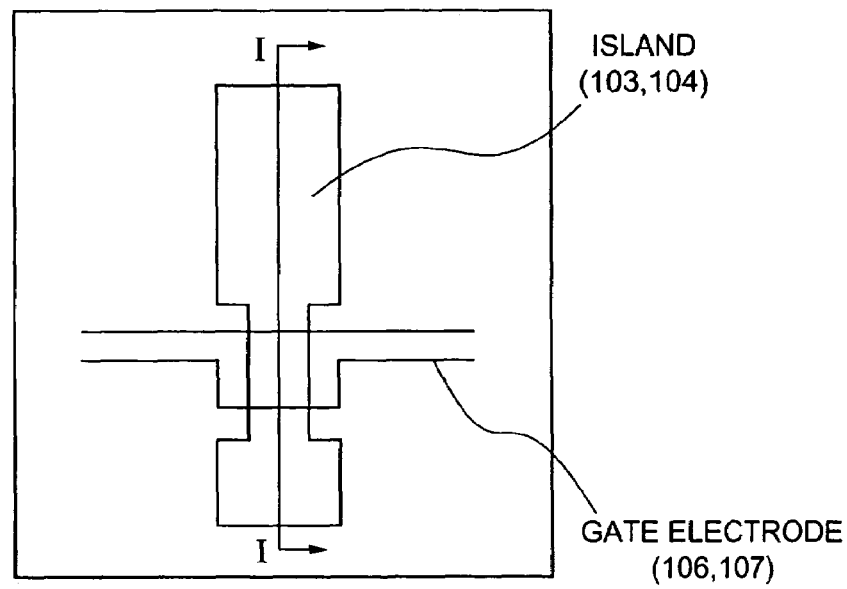
FIG. 4A is a plan view of a thin film transistor.
Figure 4B:
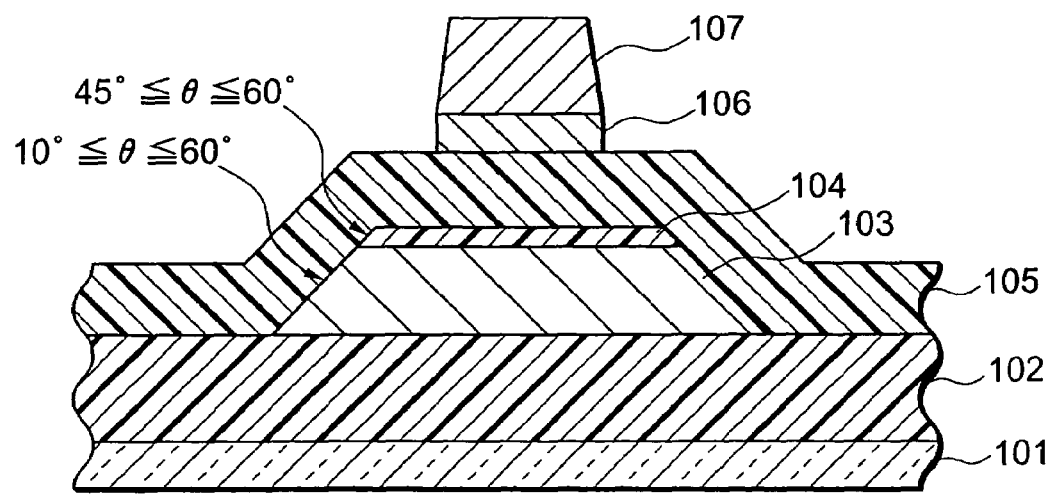
FIG. 4B is a cross-sectional view obtained by cutting the plan view of FIG. 4A along a line I-I.
Figure 5A:
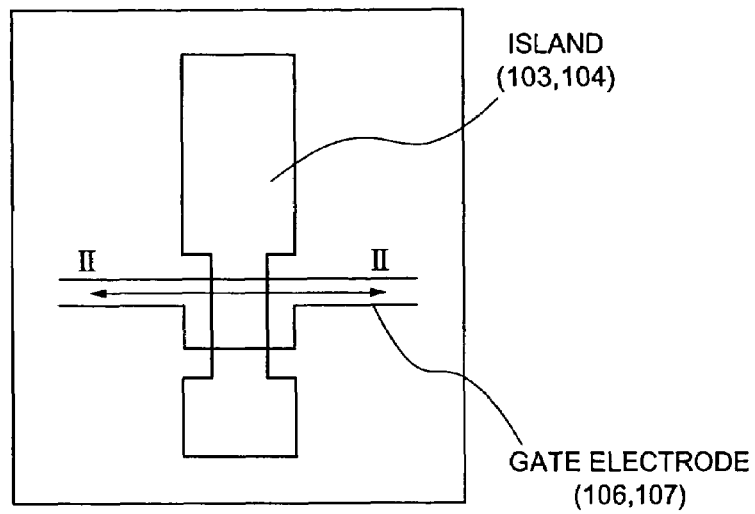
FIG. 5A is a plan view of the thin film transistor.
Figure 5B:
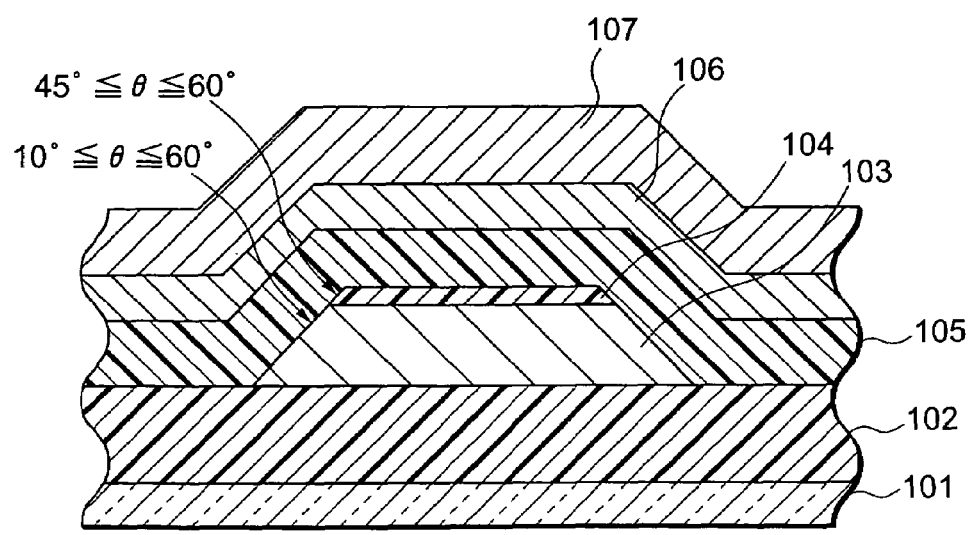
FIG. 5B is a cross-sectional view obtained by cutting the plan view of FIG. 5A along a line II-II.

A manufacturing flow of a thin film transistor device according to a first embodiment of the present invention is illustrated in FIGS. 4A, 4B, 5A and 5B. FIGS. 4A and 5A are plan views of the thin film transistor, and FIGS. 4B and 5B are cross-sectional views obtained by cutting the plan views of FIGS. 4A and 5A along directions I-I and II-II, respectively.

In FIGS. 4B and 5B, the lower oxide film 102 is deposited in a thickness of approximately 300 nm on the glass substrate 101, and the silicon film 103 and the upper oxide film 104, which configure a two-layer structure, are deposited in thicknesses of 60 nm and 10 nm, respectively, on the lower oxide film 102. Thereafter, the silicon film 103 is crystallized by an excimer laser. The silicon film 103 that has been crystallized by the excimer laser will be described below as the polysilicon film 103.

Next, the polysilicon film 103 and the upper oxide film 104, which configure the two-layer structure, are simultaneously dry etched. By this type of simultaneous etching for the two-layer structure, the tapers of the upper oxide film 104 and polysilicon film 103 with respect to the plane of the glass substrate 101 are set in ranges of: $45°<\theta<60°$; and $10°<\gamma<60°$, respectively.

Figure 6:
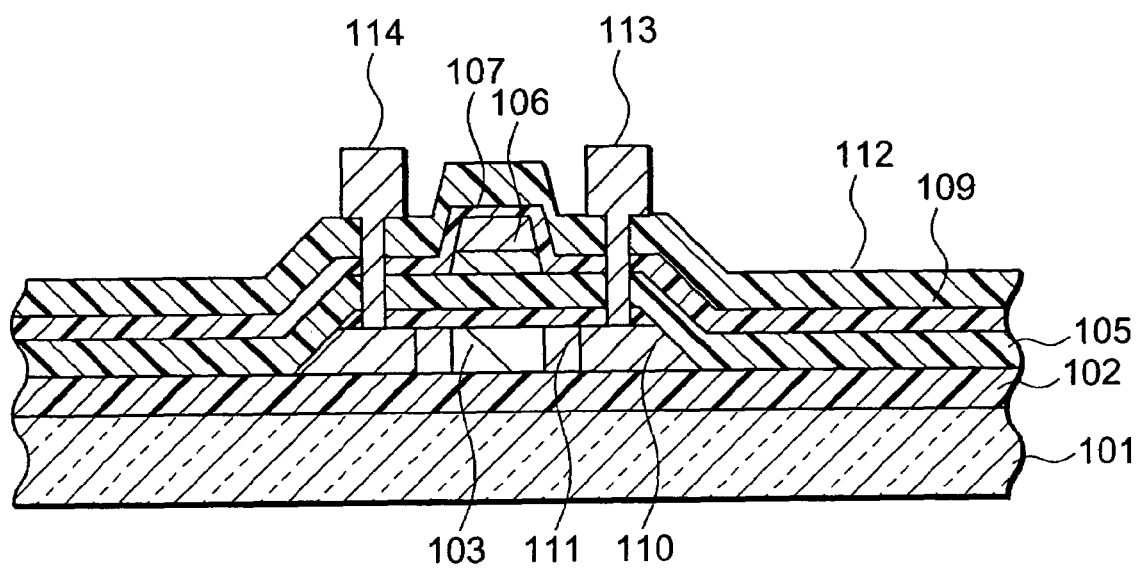
FIG. 6 is a cross-sectional view illustrating a step following FIG. 5B.

Subsequently, as illustrated in FIG. 6, after forming the two-layer structure, high-concentration phosphorus ions and phosphorus for a LDD are doped into the polysilicon film 103, thus forming the source/drain region 110 and the LDD region 111. Thereafter, the gate oxide film 105 is formed in a thickness of 45 nm to cover the two-layer structure.

Furthermore, a two-layer film composed of the microcrystalline silicon film 106 and the Cr film 107 is deposited and etched, thus forming a gate electrode. For the gate electrode, the Cr film 107 is used as a high melting point metal that is excellent at resisting heat and low in electric resistance. In addition, the μc-Si film 106 is used as an interlayer material film between the gate oxide film 105 and the Cr film 107 in order to optimize a work function of the gate electrode and because of the ease with which it controls threshold values. For the high melting point metal utilized as the gate electrode material, W, Mo, Ti, Ta or a silicide film of any of these is used as well as Cr.

Thereafter, the first interlayer oxide film 109 is further deposited in a thickness of 100 nm, followed by a heat treatment at a temperature equal to more than 350° C. to activate impurities in the phosphorus-doped polysilicon film 103, thus lowering the electric resistance of the polysilicon film.

Following the steps described above, the second interlayer oxide film 112 is further deposited in a thickness of 300 nm. Subsequently, the first and second interlayer oxide films 109 and 112 are opened to form the contact 113 to communicate with the polysilicon film. Then, the aluminum wiring 114 is provided, thus forming a desired thin film transistor.

Next, a method for setting the tapers of the upper oxide film and polysilicon film of the two-layer structure in the ranges of: $45°<\theta<60°$; and $10°<\gamma<60°$, respectively, with respect to the planer surface of the glass substrate 201 by the simultaneous etching of the upper oxide film and the polysilicon film will be described, with reference to FIGS. 7A, 7B and 7C.

Figure 7A:
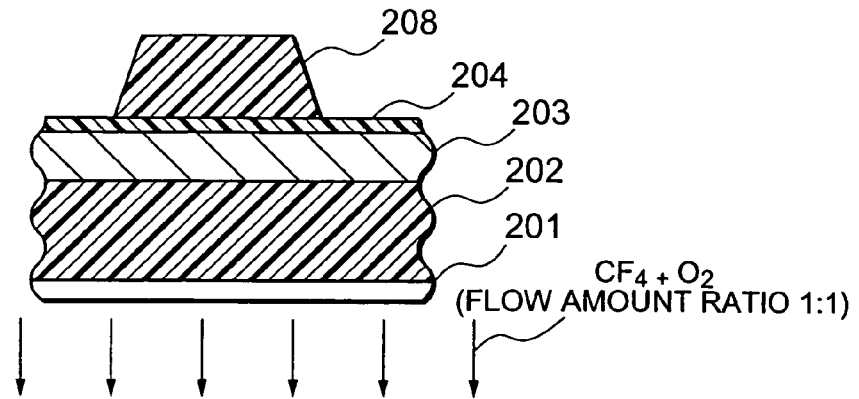
FIG. 7A is a cross-sectional view of a two-layer structure, illustrating an initial step for explaining a procedure for tapering a semiconductor film and a second oxide film, which configures a two-layer structure.

First, as illustrated in FIG. 7A, the pattern of the photoresist 208 is formed on the upper oxide film 204.

Figure 7B:
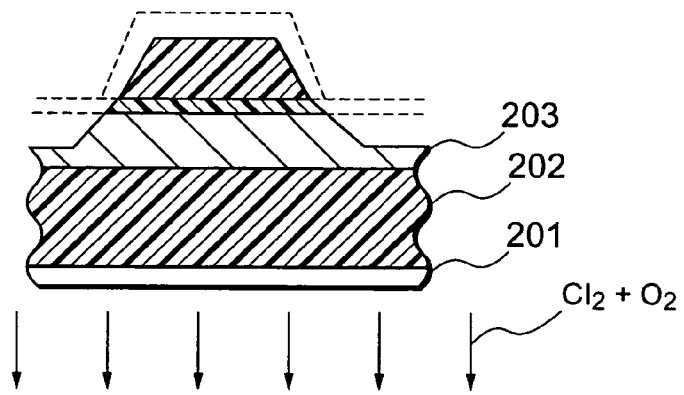
FIG. 7B is a cross-sectional view illustrating a step following FIG. 7A.

Subsequently, as illustrated in FIG. 7B, reactive ion etching is conducted on the upper oxide film 204 and the polysilicon film 203 by a gas containing $CF_4$ and $O_2$, using the photoresist 208 as an etching mask. The gas ratio of $CF_4$ and $O_2$ during this etching is set at 1:1, thus tapering the side face of the two-layer structure of the upper oxide film/polysilicon film in the range of $45°<\theta<60°$. Note that, beside the gas containing $CF_4$ and $O_2$, a mixed gas containing a fluorine-based gas, such as $CHF_3$ and $SF_6$, and $O_2$ is used.

Figure 7C:
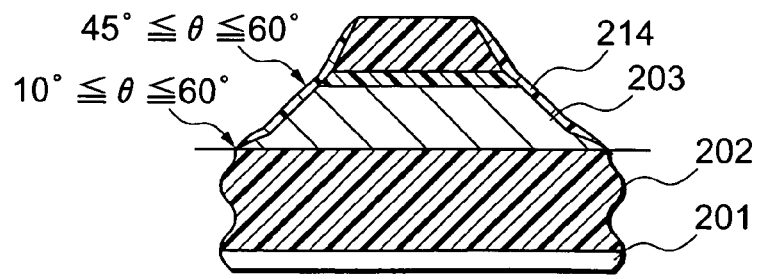
FIG. 7C is a cross-sectional view illustrating a step following FIG. 7B.

Next, as illustrated in FIG. 7C, the etching gas is switched to a gas containing $Cl_2$ and $O_2$ at the time when the polysilicon film is etched and the lower oxide film is exposed. The etching rate of the gas containing $Cl_2$ and $O_2$ for the polysilicon film is higher than that for the oxide film, thus making it possible to restrict the etching of the lower oxide film 202 to the minimum. In addition, by setting the gas ratio of $Cl_2$ and $O_2$ at 1:1, the side face of the polysilicon film 203 in the vicinity of the interface with the lower oxide film 202 can be further slanted. In this case, the deposition reaction product 214 is created on the sidewall of the resist 208 and the sidewall of the two-layer structure of the upper oxide film/polysilicon film. Therefore, the side etching of the polysilicon film 203 is prevented. Hence, the taper of the two-layer structure of the upper oxide film/polysilicon film, which is formed by use of the gas containing the $CF_4$ and $O_2$ in the gas ratio of 1:1, can be maintained. Simultaneously, the polysilicon film 203 remaining on the lower oxide film 202 due to etching variations in the glass substrate 201 is removed by the gas containing $Cl_2$ and $O_2$. Particularly, the taper angle of the polysilicon film 203 on the interface with the lower oxide film 202 ranges as: $10°<\gamma<60°$ due to the etching variations in the glass substrate.

As described above, if the method for manufacturing a thin film transistor in accordance with the first embodiment of the present invention is used, the taper angle of the side face of the two-layer structure can be reduced to 45°. Hence, as illustrated in FIG. 5B, which is a cross-sectional view obtained by cutting, along the line II-II, the portion of the two-layer structure illustrated in the plan view of FIG. 5A, the three-layer film composed of the gate oxide film 105, the μc-Si film 106 and the Cr film 107, which is deposited on the two-layer structure, is thickened on the sidewall step portion of the two-layer structure. Hence, the concentration of the stress on the oxide film 105 and the gate electrode (μc-Si film 106 and Cr film 107) in the sidewall portion of the two-layer structure is absorbed, and thus the disconnection of the gate electrode does not occur even if the thin film transistor is subjected to a heat treatment in a later step.

Next, a method for controlling the taper angles of the upper oxide film/polysilicon film using simultaneous etching in the method for manufacturing a thin film transistor device in accordance with the first embodiment of the present invention will be described below.

Figure 8:
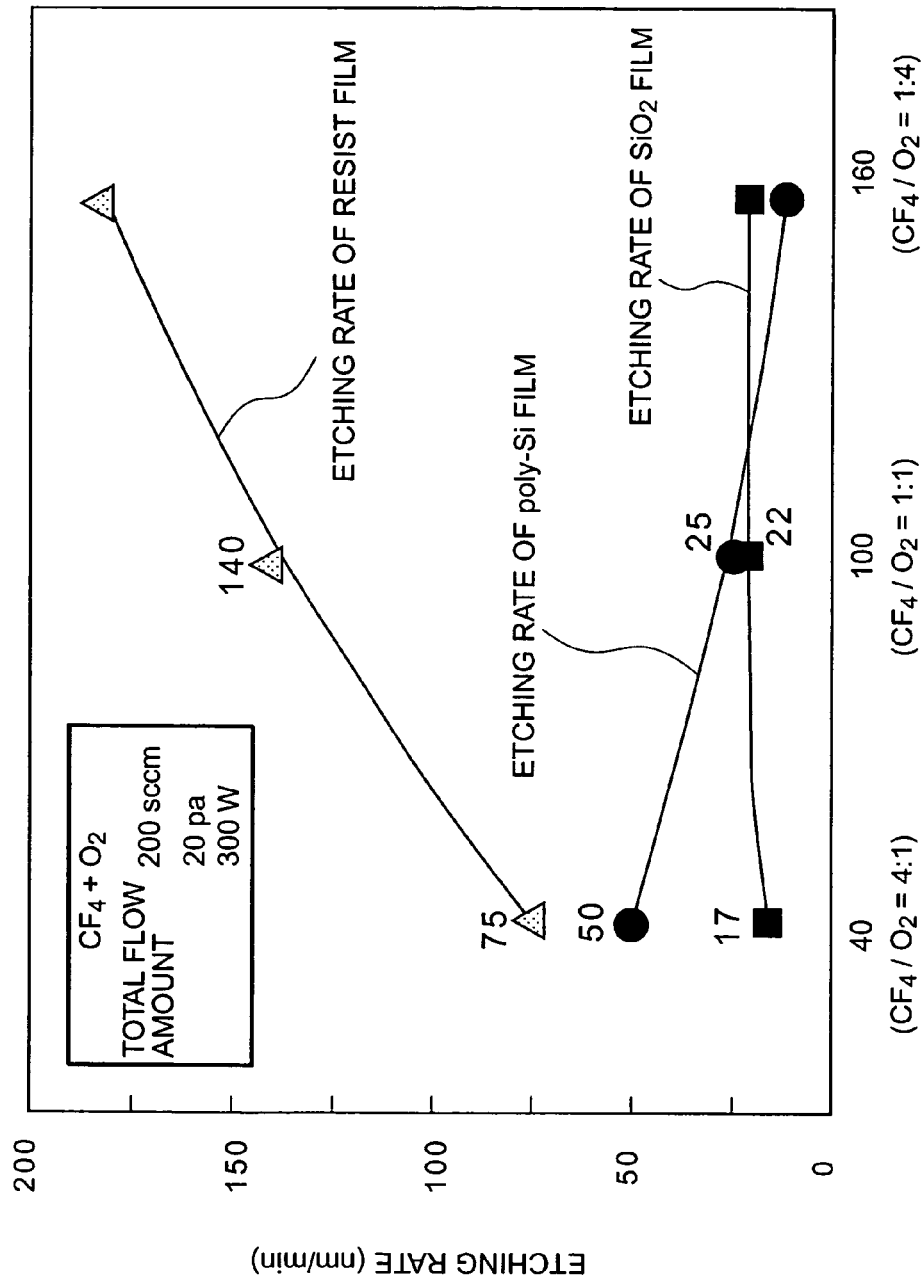
FIG. 8 is a graph showing changes of etching rates of etched films when a ratio of $CF_4:O_2$ is increased from 4:1 to 1:1 or the like in reactive ion etching by a gas containing $CF_4$ and $O_2$.

FIG. 8 shows changes of the etching rates of the oxide film, polysilicon film and resist when the ratio of $CF_4:O_2$ is increased from 4:1 to 1:1 or the like in the reactive ion etching by the gas containing $CF_4$ and $O_2$.

The etching conditions are: total gas flow amount 200 sccm; gas pressure 20 pa; and RF power 300 W.

When the flow amount ratio of $CF_4$ and $O_2$ contained in the gas for use in etching is 4:1, the etching rate of the oxide film is approximately 17 nm/min, and the etching rate of the polysilicon film is approximately 50 nm/min. The etching rate of the polysilicon film is approximately three times that of the oxide film. For this, when the ratio of $O_2$ is increased, the etching rate of the oxide film is slightly increased while the etching rate of the polysilicon film is decreased. Specifically, when the gas ratio of $CF_4:O_2$ is 1:1, the etching rate of the oxide film becomes approximately 22 nm/min, and the etching rate of the polysilicon film becomes approximately 25 nm/min, both of which become approximately equal with each other. As a result of this etching operation, the upper oxide film stops protruding with respect to the polysilicon film, and the side face of the two-layer structure becomes smooth along the interface between the upper oxide film and the polysilicon film.

When the gas ratio $CF_4:O_2$ is 4:1, the etching rate of the resist is 75 nm/min. When the ratio of $O_2$ is increased, the etching rate of the resist is increased. When the ratio of $CF_4$ and $O_2$ is 1:1, the etching rate of the resist becomes 140 nm/min, which is approximately twice that in the case of the gas ratio of 4:1. Thus, the etching of the side face of the resist advances because the etching rate of the resist is increased as compared with those of the oxide film and polysilicon film. Thus, the etched surface of the resist is set back with respect to the other etched films. The reason that the etching rate of the resist is increased following the increase of the ratio of the $O_2$ gas is as follows.

Specifically, the composition of the resist is a chemical composition in which $CH_2$, $CH_3$ and OH groups are bonded to a benzene ring of phenol novolak resin. In this composition, oxygen radicals in $O_2$ plasma attack the $CH_2$ and $CH_3$ groups to dissociate bonds thereof. Thus, the etching rate of the resist film is increased. By the etching operation described above, the oxide film and the polysilicon film are uniformly etched while the resist film is being set back in the lateral direction. In such a way, the side face of the two-layer structure of the upper oxide film/polysilicon film can be formed into the gentle taper shape in which the taper angle ranges as: 45°<θ<60° with respect to the plane of the glass substrate.

Although the example of using the gas containing $CF_4$ and $O_2$ has been described in this embodiment, a fluorine-based gas such as $CHF_3$ and $SF_6$ may be used in place of $CF_4$. Also in this case, when the flow amount ratio of $O_2$ is increased in a similar way to that of this embodiment, the etching rate of the polysilicon film is decreased, the etching rate of the oxide film is increased. However, the relationship between the ratio of the $O_2$ content and the taper angle of the side face of the two-layer structure differs depending on the type of the fluorine-based gases.

Next, the etching operation in the event of switching the etching gas from the gas containing $CF_4$ and $O_2$ to the gas containing $Cl_2$ and $O_2$ will be described.

The etching conditions are:
 Total gas flow amount: 400 sccm;
 Gas flow amount ratio: $Cl_2:O_2=1:1$;
 Gas pressure: 40 pa; and
 RF power: 400 W In the etching by the gas containing $Cl_2$ and $O_2$, the etching rate ratio of the polysilicon film to the oxide film is as large as approximately 10, and therefore, the etching of the lower oxide film can be restricted to the minimum. In addition, in the etching by the gas containing $Cl_2$ and $O_2$ in the flow amount ratio of 1:1, the resist on the polysilicon film is set back in a similar way to that of the etching by the gas containing $CF_4$ and $O_2$ in the flow amount ratio of 1:1, and the side face of the polysilicon film is tapered with a low angle. Simultaneously, $SiCl_xO_y$ that is a reaction product of the etching is deposited, thus facilitating the formation of the sidewall on the two-layer structure of the upper oxide film/polysilicon film. Hence, the side face of the polysilicon film is tapered, and the side etching of the two-layer structure of the upper oxide film/polysilicon film is prevented. Moreover, the etching amount of the lower oxide film can be restricted to the minimum while maintaining the taper added to the side face of the two-Layer structure of the upper oxide film/polysilicon film.

Timing when the polysilicon film is etched and the lower oxide film is exposed in the foregoing operation will be described below. The polysilicon film is etched fast in an outer region of the glass substrate because the etching advances fast there. Hence, at the point of time when the lower oxide film in this region is exposed, the etching of the polysilicon film is not yet completed in an inner region of the glass substrate, where the etching advances slowly. If the etching gas is switched to the gas containing $Cl_2$ and $O_2$ at this point of time, then, in the polysilicon film in the region where the etching advances slowly as described above, the resist is continuously set back in a similar way to the previous etching by the gas containing $CF_4$ and $O_2$. Simultaneously, the etching product is deposited on the side face of the two-layer structure of the already etched upper oxide film/polysilicon film. Specifically, in the region where the etching of the polysilicon film advances in the film-thickness direction, etching by the accelerated ion components of the etching gas is conducted. In addition, the etching product is deposited on the etched side face of the polysilicon film in the region where the polysilicon film is already etched in the film-thickness direction, and the side etching by the radical components of the etching gas is prevented. Moreover, in the etching by the gas containing $Cl_2$ and $O_2$, it is thought that the taper angle set in the range of 45°<θ<60° on the side face of the polysilicon film formed under the previous etching conditions by $CF_4$ and $O_2$ is further reduced by the etching product deposited on the side face of the polysilicon film. The reason is as follows. In the etching by the gas containing $Cl_2$ and $O_2$, the etching product is uniformly deposited on almost the entire surface, and simultaneously, the deposition on the surface to be etched is etched by the incidence of the reactive ions. Then, when the object to be etched is exposed, the etching advances. However, the vertically incident ions cannot remove the deposition entirely because the resist and the etching product of the sidewall portion of the two-layer structure of the upper oxide film/polysilicon film are thick, and the etching product remains on the sidewall. Hence, the width of the two-layer structure is expanded as the etching advances in the film thickness direction due to the existence of the etching product. In such a way, the etching product is deposited on the side face of the polysilicon film, and the width of the two-layer structure is expanded from the bottom as the etching advances, thus forming the taper.

As described above, it is thought that, in the side face of the two-layer structure tapered in the angle ranging as: 45°<θ<60°, the taper angle is further reduced by use of the gas in which the flow amount ratio of $Cl_2$ and $O_2$ is 1:1. Hence, in the outer region of the substrate, where the etching advances fast, the taper in the range of: 45°<θ<60°, which is formed under the previous etching conditions of $CF_4$ and $O_2$, is maintained by the deposition of the etching product on the sidewall. In the inner region of the substrate, where the etching advances slowly, the polysilicon film on the interface portion between the polysilicon film and the lower oxide film, that is, the polysilicon film etched by the gas containing $Cl_2$ and $O_2$, reduces its taper angle more than the taper angle in the range of: 45°<θ<60°, which is formed by the previous etching by the gas containing $CF_4$ and $O_2$. The taper angle of the polysilicon film in the concerned portion is reduced to approximately 10°. Hence, the taper angle of the polysilicon film becomes an angle ranging as 10°<γ<60° in the entire substrate due to the distributions as to how the etching advances in the glass substrate.

Next, as to how the pattern precision of the two-layer structure of the upper oxide film/polysilicon film is changed in the case of tapering the same by the reactive ion etching will be described below.

The etching rate for the resist under the reactive ion etching conditions in which the gas ratio of $CF_4$ and $O_2$ is 1:1 indicates the etching rate of the etching in the vertical direction. It is assumed that the etching rate in the lateral direction is approximately two thirds that in the vertical direction, and that the two-layer structure of the upper oxide film/polysilicon film is entirely etched under the etching conditions where the gas ratio of $CF_4$ and $O_2$ is 1:1. The setback amount of the resist in the lateral direction in this case is estimated to be approximately 0.27 μm based on the calculation of the etching rates for the respective films. Hence, the deviation, from a design value, of the value in the case of vertically etching the two-layer structure of the upper oxide film/polysilicon film is 0.27 μm.

Next, assuming that the taper angle of the side face of the two-layer structure when etching the two-layer structure of the upper oxide film/polysilicon film is 60°, then the deviation of the value in this case from the design value is estimated to be approximately 0.23 μm.

Hence, the two-layer structure of the upper oxide film/polysilicon film is formed into the taper shape of 60° or less by the reactive ion etching, thus making it possible to control the deviation from the design value within 0.23 µm.

Although the gas flow amount ratio of $CF_4$ and $O_2$ in the present invention is set at 1:1, the taper angle of the two-layer structure can be further reduced if the gas flow amount ratio of $O_2$ is further increased. However in this case, the etching rate for the polysilicon is reduced to greatly increase the etching time. Thus, the dimensional precision of the two-layer structure is deteriorated. Hence, 1:1 is thought to be reasonable for the gas flow amount ratio of $CF_4$ and $O_2$.

With regard to the film thicknesses of the films of the two-layer structure, it is desirable to set the thickness of the upper oxide film equal to 10 nm and the thickness of the polysilicon film equal to 60 nm. This is because the variations due to the etching are increased in the case of etching the upper oxide film and the polysilicon film when thickening the upper oxide film more than 10 nm and the polysilicon film more than 60 nm. The two-layer structure formed in this state is deteriorated in dimensional precision, leading to the deterioration of the OFF characteristics of the TFT.

As mentioned above, in accordance with the contents of the present invention, in the two-layer film of the two-layer structure portion, the taper angle of the upper oxide film of the island portion is controlled in the range of: $45°<\theta<60°$, and the taper angle of the polysilicon layer thereof is controlled in the range of $10°<\gamma<60°$. Thus, the step coverage for the gate oxide film and the Cr/µc-Si stacked film after the formation of the two-layer structure is enhanced. Moreover, the disconnection of the gate electrode can be prevented in a portion where the gate electrode crosses over the two-layer structure. In addition, the lower oxide film of the two-layer structure is made not to be etched as much as possible, thus reducing the excessive etching and side etching of the lower oxide film of the two-layer structure. Thus, the coverage defect of the gate oxide film and the disconnection of the gate electrode can be prevented.

Meanwhile, the two-layer structure of the lower oxide film/polysilicon film in the present invention is tapered, thus making it possible to prevent the occurrence of the crack in the gate electrode which crosses over the two-layer structure.

Figure 9:
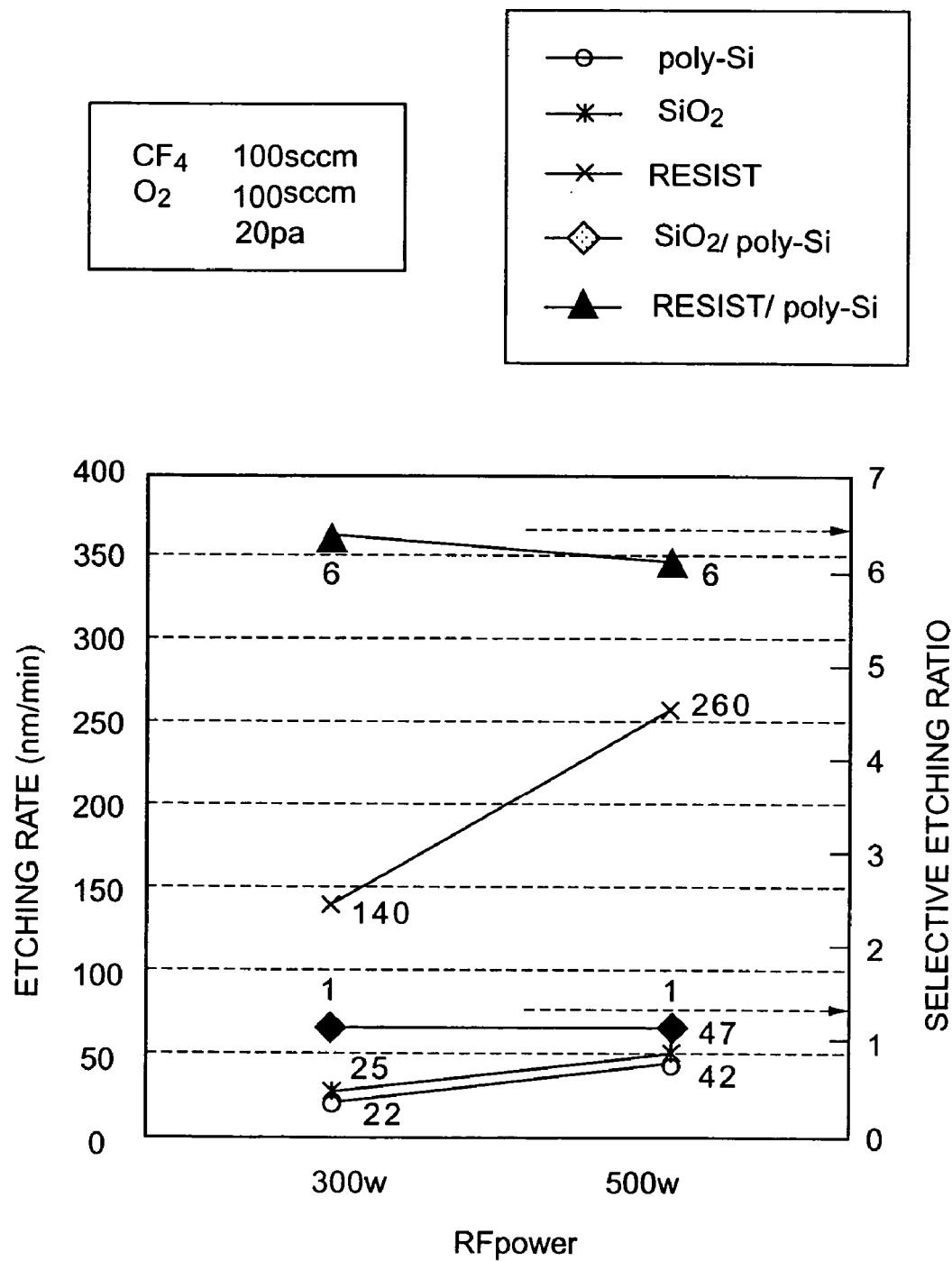
FIG. 9 is a graph showing RF power dependencies of etching rates of etching gases for etched films.

Next, a second embodiment of the method for forming a pattern of a stacked film of the present invention will be described. In the second embodiment, the etching time for the reactive ion etching by the gas containing $CF_4$ and $O_2$ when forming the two-layer structure of the lower oxide film/polysilicon film is shortened. FIG. 9 shows RF power dependencies of etching rates, for respective films, of etching gases for use in the second embodiment.

Similarly to the first embodiment, the upper oxide film and the polysilicon film undergo the reactive ion etching by the gas series of $CF_4$ and $O_2$ by use of the photoresist as an etching mask until the lower oxide film is exposed. In this case, in the second embodiment, the etching conditions are set as:

gas flow amount ratio of $CF_4$ and $O_2$:1:1;
total gas flow amount: 200 sccm;
gas pressure: 20 Pa; and
RF power: 300 W and 500 W When the RF power is increased from 300 W to 500 W, though the etching rate for the polysilicon film is approximately doubled (40 nm/min), its selective etching ratio comparing with the lower oxide film is hardly changed (=approximately 1), and its selective etching ratio comparing with the photoresist is hardly changed (=approximately 6), either. Therefore, the etching time can be shortened while maintaining the taper angle of the upper oxide film of the two-layer structure in the range of: $45°<\theta<60°$ and the taper angle of the polysilicon layer thereof in the rage of: $10°<\gamma<60°$, thus making it possible to enhance the processing capability of the apparatus. Moreover, when the etching rate is increased, a ratio of a change in intensity of plasma emission for use in detecting the end point of the etching is increased, and therefore, a definite detection for the end point can be performed.

From the point of time when the lower oxide film is exposed, the etching gas is switched to the gas containing $Cl_2$ and $O_2$. Thus, the etching amount of the lower oxide film can be minimized, and the side etching of the polysilicon film can also be restricted. Accordingly, the taper of the two-layer structure processed by the gas series of $CF_4$ and $O_2$ can be maintained. Hence, the step coverage of the gate insulating film and gate electrode, which cross over the two-layer structure after the formation thereof is enhanced, thus making it possible to prevent the gate electrode from being disconnected.

As described above, according to the method for forming a pattern of a stacked film, the first oxide film, the semiconductor film and the second oxide film are sequentially deposited on the substrate, and the semiconductor film is laser annealed. Thereafter, the resist pattern is formed on the second oxide film, and by use of the resist pattern as a mask, the second oxide film and the semiconductor film are dry etched to form the pattern of the stacked film (two-layer structure) composed of the semiconductor film and the second oxide film. At this time, the fluorine-based gas is used as the dry etching gas for the second oxide film and the semiconductor film, and the etching gas is switched from the fluorine-based gas to the chlorine-based gas at the point of time when the first oxide film is exposed. The mixed gas of $CF_4$ and $O_2$ is used as the fluorine-based gas, and suitably, the gas ratio of $CF_4$ and $O_2$ in the mixed gas is set at 1:1, thus conducting the dry etching therefor. In such a way, the taper angle of the second oxide film of the pattern of the stacked film can be made larger than the taper angle of the semiconductor film thereof. Specifically, the taper angles of the second oxide film and semiconductor film can be controlled into the ranges of: $45°<\theta<60°$ and $10°<\gamma<60°$, respectively. Hence, the step disconnection of the wiring that crosses over this pattern of the stacked film can be prevented.

What is claimed is:

1. A stacked film for a thin film transistor, said stacked film comprising:
   a first oxide film formed on a substrate;
   a polysilicon film formed on said first oxide film and having a tapered sidewall with a taper angle in a range $10°<\gamma<60°$; and
   a second oxide film formed on said polysilicon film and having a tapered sidewall which has a taper angle in a range $45°<\theta<60°$,
   wherein said tapered sidewall of said second oxide film comprises an end which adjoins said tapered sidewall of said polysilicon film, and extends inwardly from said end over said polysilicon film and wherein said taper angles of said tapered sidewalls of said polysilicon and second oxide films comprise angles of sidewalls of said polysilicon and second oxide films with respect to a plane of said substrate.

2. The stacked film of claim 1, wherein said taper angle of said tapered sidewall of said second oxide film is greater than said taper angle of said tapered sidewall of said polysilicon film.

3. The stacked film of claim 1, wherein a film thickness ratio of a thickness of said second oxide film to a thickness of said polysilicon film is 1:6.

4. The stacked film of claim 1, wherein a thickness of said second oxide film is no greater than 10 nm and a thickness of said polysilicon film is no greater than 60 nm.

5. The stacked film of claim 1, wherein said first oxide film comprises silicon dioxide.

6. The stacked film of claim 1, wherein said polysilicon film comprises a partially phosphorus-doped polysilicon film.

7. The stacked film of claim 1, wherein said second oxide film and said polysilicon film comprise a pattern, and
wherein an insulating film is formed on said second oxide film and a wiring layer is formed on said insulating film, said wiring layer crossing over said pattern.

8. The stacked film of claim 1, wherein said stacked film comprises plural tapered sidewalls which are formed on opposing sides of said stacked film.

9. The stacked film of claim 8, wherein said polysilicon film and said second oxide film form an island on said first oxide film, said plural tapered sidewalls comprising plural tapered sidewalls of said island.

10. The stacked film of claim 9, wherein said plural tapered sidewalls of said island are formed around a periphery of said island.

11. A thin film transistor, comprising:
a stacked film comprising:
a polysilicon film formed on a first oxide film and having a tapered sidewall with a taper angle in a range $10°<\gamma<60°$; and
a second oxide film formed on said polysilicon film and having a tapered sidewall which has a taper angle in a range $45°<\theta<60°$;
a gate insulating layer formed on said stacked film; and
a gate electrode layer formed on said gate insulating layer
wherein said tapered sidewall of said second oxide film comprises an end which adjoins, said tapered sidewall of said polysilicon film, and extends inwardly from said end over said polysilicon film and wherein said stack film is formed on a substrate, said taper angles of said tapered sidewalls of said polysilicon and second oxide films comprising angles of sidewalls of said polysilicon and second oxide films with respect to a plane of said substrate.

12. The thin film transistor of claim 11, wherein said gate insulating layer and said gate electrode layer are formed on said tapered sidewall of said polysilicon film and said tapered sidewall of said second oxide film.

13. The thin film transistor of claim 12, wherein a thickness of said gate insulating layer and said gate electrode layer is substantially uniform.

14. The thin film transistor of claim 12, wherein said gate insulating layer and said gate electrode layer are formed on said first oxide film.

15. The thin film transistor of claim 14, wherein a thickness of said gate insulating layer on said sidewalls of said polysilicon film and said second oxide film is substantially equal to a thickness of said gate insulating layer on said first oxide film.

16. The thin film transistor of claim 14, wherein a thickness of said gate electrode layer and on said sidewalls of said polysilicon film and said second oxide film is substantially equal to a thickness of said gate electrode layer on said first oxide film.

17. The thin film transistor of claim 11, wherein said gate electrode layer comprises:
an interlayer film; and
a metal film formed on said interlayer film.

18. The thin film transistor of claim 17, wherein said interlayer film comprises a microcrystalline silicon film, and said metal film comprises a chromium film.

19. The thin film transistor of claim 17, wherein said gate electrode comprises a member selected from a group consisting of Cr, W, Mo, Ti, Ta and a silicide film of any of these.

20. A stacked fun for a thin film transistor, said stacked film comprising:
a polysilicon film formed on a first oxide film and having a tapered sidewall with a taper angle in a range $10°<\gamma<60°$; and
a second oxide film formed on said polysilicon film end having a tapered sidewall which has a taper angle in a range $45°<\theta<60°$,
wherein said tapered sidewall of said second oxide film comprises an end which adjoins said tapered sidewall of said polysilicon film, and extends inwardly from said end over said polysilicon film and wherein said first oxide film is formed on a substrate, said taper angles of said tapered sidewalls of said polysilicon and second oxide films comprising angles of sidewalls of said polysilicon and second oxide films with respect to a plane of said substrate.

* * * * *